United States Patent [19]

Matsumaru et al.

[11] Patent Number: 6,011,399

[45] Date of Patent: *Jan. 4, 2000

[54] FAULT LOCATOR APPARATUS FOR WIRE HARNESSES

[75] Inventors: Akio Matsumaru; Yoshiyuki Miyazaki; Motonori Kido, all of Nagoya, Japan

[73] Assignees: Sumitomo Wiring Systems, Ltd.; Harness System Technologies Research, Ltd.; Sumitomo Electric Industries, Ltd., all of, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/774,610

[22] Filed: Dec. 30, 1996

[30] Foreign Application Priority Data

Jan. 10, 1996 [JP] Japan .................................. 8-002333

[51] Int. Cl.[7] ...................................................... G01R 31/00
[52] U.S. Cl. ........................................... 324/538; 324/539
[58] Field of Search ...................................... 324/522, 538, 324/52, 539, 503; 439/497; 356/73.1; 317/18

[56] References Cited

U.S. PATENT DOCUMENTS

| | | | |
|---|---|---|---|
| 3,611,035 | 10/1971 | Douglas | 317/18 |
| 3,624,267 | 11/1971 | Plummer | 174/36 |
| 3,794,884 | 2/1974 | Sircom | 317/18 |
| 3,909,712 | 9/1975 | Rietz | 324/52 |
| 4,291,204 | 9/1981 | Crick | 179/175 |
| 4,859,953 | 8/1989 | Young et al. | 324/66 |
| 5,119,546 | 6/1992 | Cameron | 29/748 |
| 5,231,357 | 7/1993 | Moody | 324/539 |
| 5,264,796 | 11/1993 | Klassen | 324/503 |
| 5,358,426 | 10/1994 | Henschen | 439/497 |
| 5,374,778 | 12/1994 | Hashimoto | 174/36 |
| 5,401,010 | 3/1995 | Haswell et al. | 269/45 |
| 5,500,730 | 3/1996 | Johnson | 356/73.1 |
| 5,600,248 | 2/1997 | Westrom | 324/522 |

FOREIGN PATENT DOCUMENTS

| | | |
|---|---|---|
| 0450807 | 10/1991 | European Pat. Off. . |
| 2097214 | 10/1982 | United Kingdom . |

*Primary Examiner*—Josie Ballato
*Assistant Examiner*—José Solis
*Attorney, Agent, or Firm*—Jordan B. Bierman; Bierman, Muserlian and Lucas

[57] ABSTRACT

An apparatus for detecting a trouble location in a wire harness can easily detect a location of any trouble such as breakage or short circuit in electric wires in a wire harness and in particular can detect the trouble location by way of a simple structure utilizing a portion with a shield function. In the detecting apparatus, a pulse signal is transmitted in electric wires (2) in a wire harness (1), in which a trouble location is to be detected, and in a sensing line juxtaposed along the electric wires (2) at their ends. A measuring device (20) receives a reflected wave from a transmitted wave and measures a difference in time between the transmitted wave and the reflected wave. A distance from a transmitting end point to a trouble location point is determined in accordance with the difference in time and a signal propagation velocity. Each electric wire (2) in the wire harness (1) is a single wire having no splice portion and a shielded wire having a conductive shield sheath (10). The wire harness (1) is provided with a connection part for connecting each electric wire (2) and the shield sheath (10) to the measuring device (20).

8 Claims, 8 Drawing Sheets

FAULT LOCATOR APPARATUS FOR WIRE HARNESSES

BACKGROUND OF THE INVENTION

This invention relates to an apparatus for detecting a trouble location of breakage, short circuit or the like in wire harnesses in an automotive vehicle.

Wire harnesses mounted in an automotive vehicle are subject to breakage or short circuit due to entanglement of electric wires for long time use of a car, interference with other parts caused by vibration during driving, wear of electric wires caused by mutual rubbing or deterioration of the wires caused by repeated bending upon opening and closing a door. When such troubles occur, electrical equipment will not operate. Heretofore, detection and repair of troubles in wire harnesses have been done by the following steps of:

(1) finding a trouble wire (circuit) by using a tester;

(2) searching electric wires arranged in an interior of an automotive vehicle by referring to a wiring circuit diagram and detaching all parts of the searched electric wire from the interior;

(3) extracting a wire harness secured to a car body by clamps or the like;

(4) detaching an exterior of the wire harness, and finding and repairing a faulty electric wire, for example, in the case of breakage of the wire, pressing a terminal onto the faulty portion, soldering it and insulating the connected portion with tape;

(5) returning the exterior of the wire harness to the original location, securing the wire harness to the car body by the clamps or the like and attaching all of the detached interior parts to the interior.

In such a common process, the step (1) cannot detect a faulty location, although it can find the trouble wire (breakage or short circuit) and the steps (2) to (5) involve a considerable amount of labor and time to find the broken portion.

Heretofore, in order to overcome such a problem, for example, Japanese Utility Model Public Disclosure No. HEI 4-22311 (1992) discloses an apparatus for detecting a broken location, in which a sensing electric wire is provided close to a conductive line in electric wires for electrical wiring, the sensing wire for breakage is connected to a first terminal of an adapter, each of the conductive lines is connected to a second, third ... terminals, and a detector including first and second measuring units, an AC power source, and an amperemeter is provided. In this apparatus, the first and second measuring units are connected to the first terminal and to a terminal corresponding to the conductive line in breakage, and an AC voltage is applied across the measuring units. A distance from a reference point to a breakage point is determined by a current value flowing between the measuring units.

The apparatus disclosed in the Public Disclosure mentioned above detects the breakage location by means of a so-called capacitance measurement method and can make it easier than the common detecting method to detect the breakage location. However, since the sensing lines must be arranged to come into close contact with the conductive wires being measured, in the case of applying them to existing wire harnesses on an automotive vehicle, it is necessary to change the type of electric wire and to increase the number of wires. This results in a large wire harness. Consequently, there are several problems that it is difficult to define an arrangement space in the automotive vehicle, interference between ambient parts and the wire harness tends to be caused, and exterior parts for protecting the wire harness will be increased. Also, this apparatus cannot detect short circuit in the wire harness and can detect only breakage.

In an underground electric cable or the like, a pulse radar method mentioned after in detail has been known to detect breakage and short circuit. However, this method has been applied to an underground electric cable which is long and has no branch. It has been difficult heretofore to directly apply the method to a wire harness which is arranged in an automotive vehicle, is short and has branches on intermedium portions.

SUMMARY OF THE INVENTION

An object of the present invention is to provide an apparatus for detecting a trouble location in a wire harness which can easily detect a location of any trouble such as breakage or short circuit in electric wires in a wire harness by utilizing a so-called pulse radar method and in particular can detect the trouble location by means of a simple structure utilizing a part of a shield member which serves to protect electric wires in the wire harness from external noise.

In order to achieve the above object, an apparatus for detecting a trouble location in a wire harness in accordance with the present invention, comprises: a wire harness having a plurality of electric wires, in which a trouble location is to be detected, each of said electric wires being a single wire having no splice portion; a plurality of sensing lines juxtaposed along the electric wires; and a measuring device which transmits a pulse signal in the electric wires and the sensing lines at their ends and receives a reflected wave from a transmitted wave, thereby measuring a difference in time between the transmitted wave and the reflected wave. The wire harness is provided with a connection part for connecting each of the electric wires and each of the sensing lines to the measuring device. Consequently, a distance from a transmitting end point to a trouble location point is determined in accordance with the difference in time and a signal propagation velocity.

Each of the electric wires in the wire harness may be a single wire having no splice portion and may be covered with a conductive shield sheath. The wire harness may be provided with a connection part for connecting each of the electric wires and each shield sheath to the measuring device, thereby using the shield sheath as a sensing line upon detecting the trouble location.

It is possible to easily and precisely detect the trouble location in any one of electric wires in the wire harness since the so-called pulse radar method is effectively applied to the wire harness according to the above apparatus of the present invention. In particular, it is possible to obtain a shield function and a trouble location detecting function by means of a relatively simple structure which utilizes each electric wire as a shield line and the shield sheath as the sensing line.

Each of the electric wires in the wire harness may be a single insulation-sheathed wire having no splice and the electric wires are protected by a sheath member having a conductive layer. The wire harness may be provided with a connection part for connecting each of the electric wires and the conductive layer to the measuring device, thereby using the conductive layer as a sensing line upon detecting the trouble location.

It is also possible to obtain a shield function and a trouble location detecting function by means of a relatively simple structure which utilizes the pulse radar method, according to the above apparatus.

The apparatus of the present invention effects detection of a trouble location in a wire harness by utilizing the pulse radar method. Heretofore, the pulse radar method has been utilized in detection of a trouble location in an underground transmitting line and thus a principle of the pulse radar method has been known.

A wire harness which is arranged in an automotive vehicle or the like, however, is extremely shorter than the underground transmitting line. An error in detection of the trouble location in the wire harness must be exceedingly small. This requires a particular device in setting a pulse width, a period, and the like of a transmitting pulse.

Accordingly, the pulse width, period, and the like of the transmitting pulse may be preferably set as follows in consideration of a pulse propagation velocity and a length of a wire harness, which can be known by means of actual measurement, a possible measuring range of a trouble location to be required, and the like. That is, preferably, a pulse width A, a period B, and a duty ratio (A/B) of the pulse signal are set to be 0.049–0.976 n sec, 48.78 n sec, and 0.001–0.020, respectively.

The measuring device may be provided with a connector to be connected to a mating connector of the wire harness.

A connector for electrical wiring, which is connected to the wire harness, may be adapted to be detachably coupled to a mating connector for splicing.

The sheath member may be a tape which includes a conductive layer between insulation layers, and an adhesive layer on either surface of the insulation layers. Alternatively, the sheath member is a tube having a conductive layer between insulation layers.

BRIEF DESCRIPTION OF THE DRAWINGS

FIGS. 10($a$), 10($b$), and 10($c$) are explanatory views illustrating the respective steps of working an end of the sheath for a wire harness;

FIGS. 11($a$), 11($b$), and 11($c$) are explanatory views illustrating another steps of working an end of the sheath for a wire harness;

FIGS. 12($a$) and 12($b$) are explanatory views illustrating the respective steps of attaching the sheath to a wire harness;

DETAILED DESCRIPTION OF THE PREFERRED EMBODIMENTS

Embodiments of an apparatus for detecting a trouble location in a wire harness in accordance with the present invention will be explained below by referring to the drawings.

Figure 1:
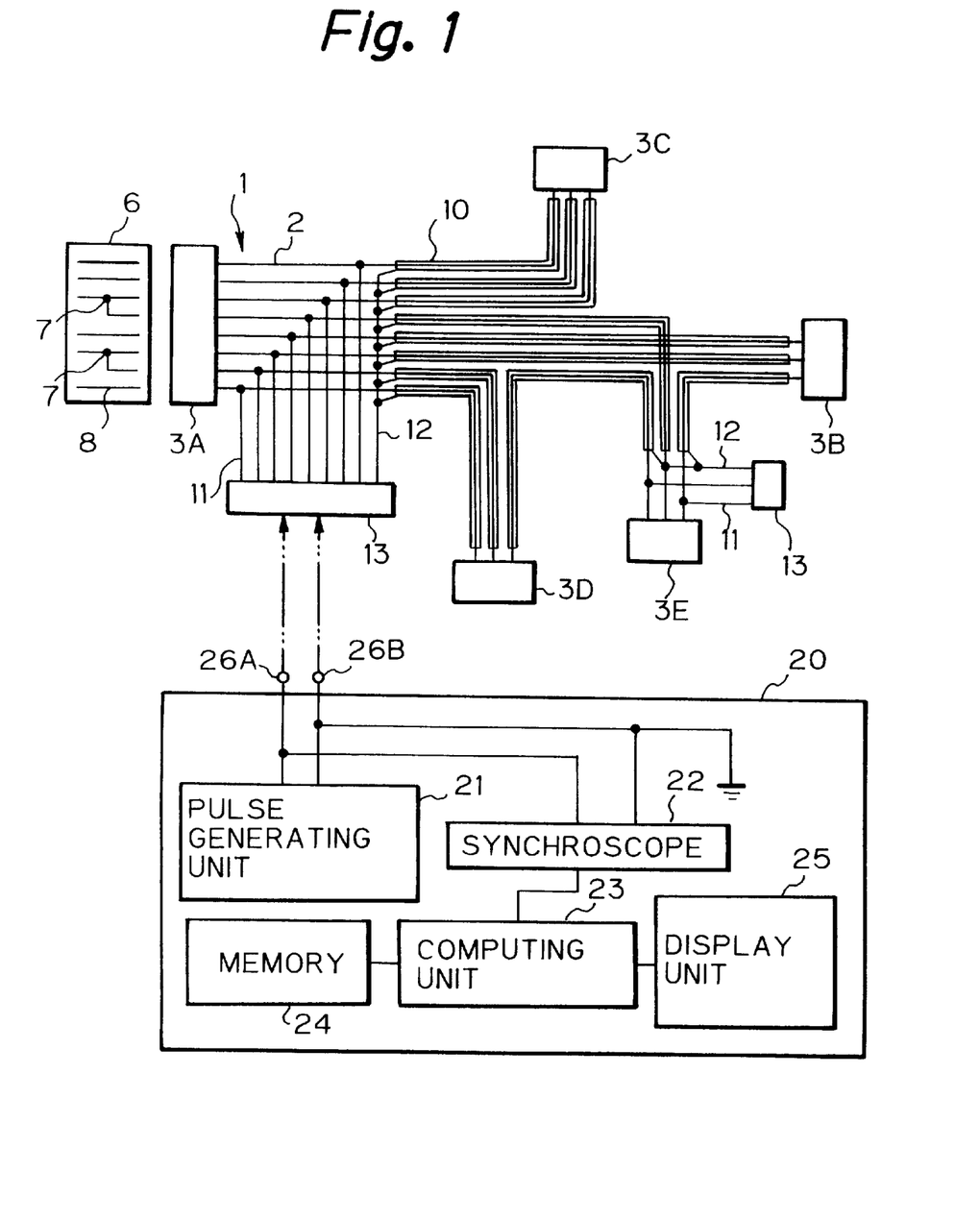
FIG. 1 is a schematic block diagram of a first embodiment of an apparatus for detecting a trouble location in a wire harness in accordance with the present invention.
Figure 2:
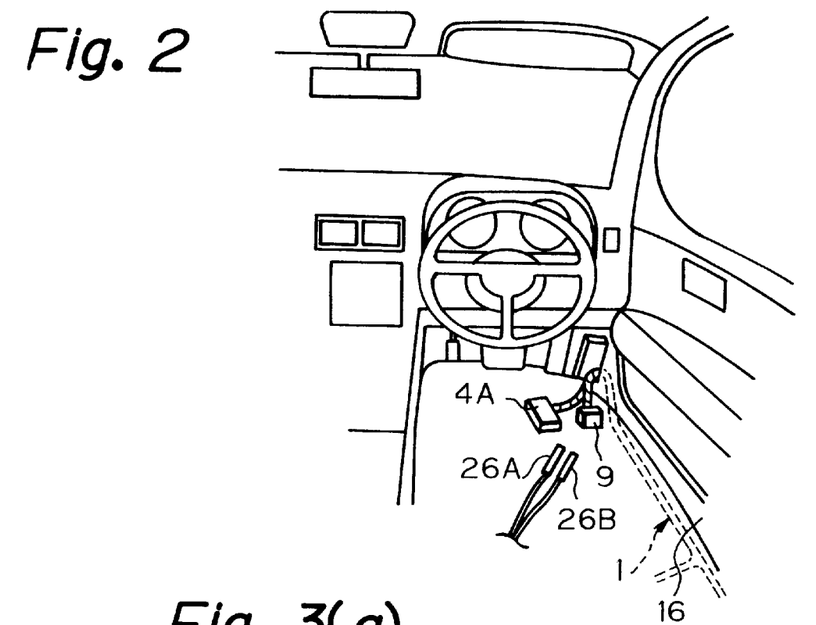
FIG. 2 is a fragmentary perspective view of an interior in an automotive vehicle, illustrating an arrangement of a wire harness in the interior.
Figure 3A:
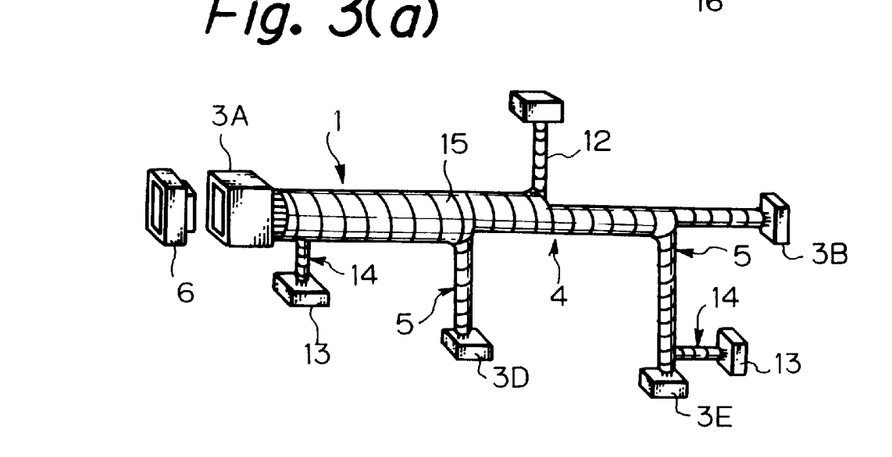
FIG. 3 is a perspective view of a wire harness, illustrating a whole structure (FIG. 3($a$)) of the wire harness and an end structure FIG. 3($b$)) of the wire harness.
Figure 3B:
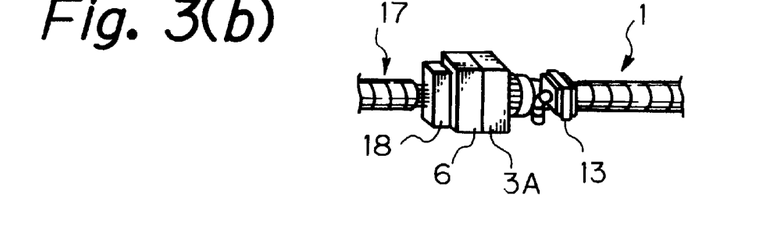

FIG. 1 is a schematic block diagram of a first embodiment of an apparatus for detecting a trouble location in a wire harness 1 in accordance with the present invention. FIG. 2 is a fragmentary perspective view of an interior in an automotive vehicle, illustrating an arrangement of the wire harness 1 in the interior. FIG. 3 is a perspective view of the wire harness 1, illustrating a whole structure (FIG. 3($a$)) of the wire harness 1 and an end structure (FIG. 3($b$)) of the wire harness 1. In these drawings, the wire harness 1 has a number of electric wires 2, which are arranged among a plurality (five in the drawings) of connectors 3A to 3E for electrical wiring. In the illustrated example, a main line part 4 is arranged between a first connector 3A and a second connector 3B and branch line parts 5, 5 branched from the main line part 4 extend to third to fifth connectors 3C to 3E.

Each electric wire 2 in the wire harness 1 is a single wire having no splice portion (branch connection portion). That is, the electric wire 2 extending from the main line part 4 to the branch line part 5 is a single wire bent from the main line part 4 to the branch line part 5 without making a splice. A connector 6 for splice is adapted to be detachably coupled to a connector 3A for partial electrical wiring.

In general, a wire harness needs a branch wiring portion in which a splice line (branch line) is branched from a main line part through a splice portion (branch connection portion). In this case, heretofore, the splice portion is usually provided on an intermediate section of the electric wire between connectors. In the wire harness in this embodiment, however, the splice portion is not provided on an intermediate section of the electric wire. An electrical wiring 8 having the splice portion 7 is formed of a bus bar or the like in the connector 6 for splice adapted to be coupled to the connector 3A in compliance with requirement of electrical wiring.

Each electric wires 2 is a shield wire having a conductive shield sheath 10. Each electric wire 11 for measuring is connected to each electric wire 2 near the connectors 3A and 3E while a common sensing electric wire 12 is connected to the shield sheath 10 of each electric wire 2. The distal ends of the measuring and sensing electric wires 11 and 12 near the connectors 3A and 3E are connected to a detecting connector 13. As shown in FIG. 3 schematically, the main line part 4 of the wire harness 1 and the branch line part 4 of the harness 1 make branches of electric wire leading portions 14 for measuring and sensing in the vicinity of the connectors 3A and 3E. The leading portions 14 are provided on the distal end with the detecting connectors 13. A sheath member 15 serves to protect the main line part 4, branch line part 5 and electric wire leading portion 14.

The wire harness 1 is arranged on a car body 16 of an automotive vehicle. On a usual use, as shown in FIG. 3($b$), the connector 3A is coupled to a mating connector 18 connected to another wire harness 17, to a joint box, or to the like through the splice connector 6 while the detecting connector 13 is secured to the sheath member 15 by means of a tape or the like. On a detecting process of a trouble location described after, the connector 3A is detached from the splice connector 6 and the detecting connector 13 is released from the sheath member 15 by removing the tape or the like.

A measuring device 20 which serves to detect a trouble location in the wire harness 1, as shown in FIG. 1 comprises a pulse generating unit 21, a synchroscope 22, a computing unit 23, a memory 24, a display unit 25, and a pair of terminals 26A, 26B. The pulse generating unit 21 and synchroscope 22 are connected to the pair of terminals 26A, 26B while one terminal 26B is connected to the ground.

Next, an operation of the above embodiment of the apparatus for detecting a trouble location in a wire harness in accordance with the present invention will be explained below.

The apparatus of the present invention detects a trouble location by utilizing a pulse radar method. A principle of this pulse radar method will be explained by referring to FIGS. 4 and 5. Assuming that an electric wire 2 in a trouble such as breakage is a measuring line W1 and a conductor extending in parallel with the measuring line W1 (a shield sheath 10 in this embodiment) is a sensing line W2, both lines W1 and W2 are connected to the pulse generating unit 21, the sensing line W2 is connected to the ground, and a pulse wave Pa from the pulse generating unit 21 is transmitted in the lines W1 and W2 at their ends. Then, the pulse wave Pa propagates in the lines while being attenuated gradually in compliance with line characteristics. If there is in the line a portion in which a characteristic impedance is changed on account of breakage or short circuit in the line, the pulse wave Pa is reflected at the portion.

Figure 4:
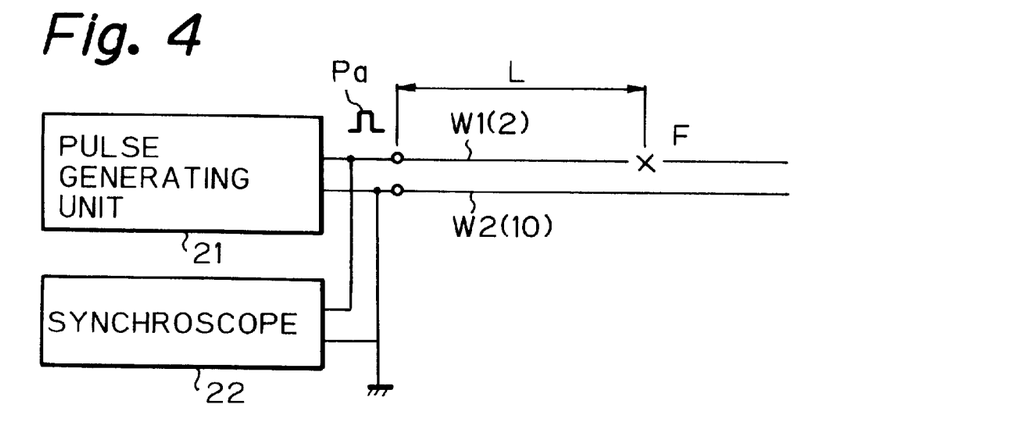
FIG. 4 is an explanatory view of a pulse radar method.

Assuming that L is a distance from an end of the line to a pulse reflecting portion (trouble location), v is a pulse propagation velocity, t is a pulse propagation time (a difference in time between a transmitted wave Pa and a reflected wave Pb), and $\in$ is a dielectric constant in a line, the following equations (1) and (2) are given:

$$L = v \cdot t / 2 \quad (1)$$

$$v = 300 / \sqrt{\varepsilon} \quad (2)$$

The pulse propagation time t can be measured by the synchroscope 22 in the measuring device 20. If the pulse propagation velocity v or the dielectric constant $\in$ is given beforehand, for example, if the pulse propagation velocity v is given by measuring the pulse propagation time t in a normal state and a line length, the distance L can be obtained from the pulse propagation velocity v and the measured value of the pulse propagation time t.

An amplitude and a polarity of the reflected wave Pb is determined by a reflection constant m given by the following equation (3).

$$m=(Ze-Zo)/(Ze+Zo) \quad (3)$$

here,

Ze: characteristic impedance at a reflection point

Zo: characteristic impedance in a line

If there is breakage in a line, the following equations (4) and (5) are given.

$$Ze \rightarrow \infty \quad (4)$$

$$m=(1-Zo/Ze)/(1+Zo/Ze) \rightarrow +1 \quad (5)$$

If there is short circuit in a line, the following equations (6) and (7) are given.

$$Ze \rightarrow 0 \quad (6)$$

$$m=(Ze-Zo)/(Ze+Zo) \rightarrow -1 \quad (7)$$

Figure 5:
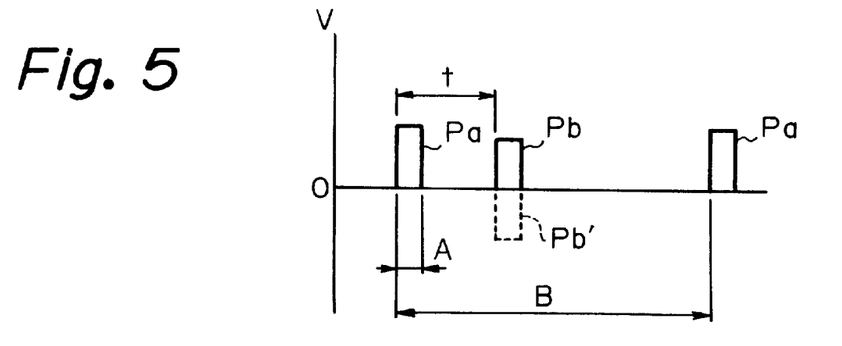
FIG. 5 is a graph illustrates transmitted pulses and a reflected pulse in the pulse radar method.

That is, as shown in FIG. 5, the reflected wave Pb (solid line in FIG. 5) on the occasion of breakage has the same polarity as the transmitted wave Pa while the reflected wave Pb' (dotted line in FIG. 5) on the occasion of short circuit has the reverse polarity to the transmitted wave Pa. Accordingly, it is also possible to determine whether the trouble in the line is breakage or short circuit in accordance with the polarity of the reflected wave.

Heretofore, the pulse radar method has been utilized in detection of a trouble point in an underground transmitting line and thus a principle of the pulse radar method has been known.

A wire harness which is arranged in an automotive vehicle or the like, however, is extremely shorter than the underground transmitting line. An error in detection of the trouble location in the wire harness must be exceedingly small. This requires a particular device in setting a pulse width, a period, and the like of a transmitting pulse.

Accordingly, the pulse width, period, and the like of the transmitting pulse may be preferably set, as shown in Table 1, in consideration of a pulse propagation velocity and a length of a wire harness, which can be known by means of actual measurement, a possible measuring range of a trouble location to be required, and the like.

TABLE 1

| Distance from a measuring point to a start point capable of measuring a trouble location [cm] | Pulse width A [n sec] | Period B [n sec] | Duty ratio (A/B) |
| --- | --- | --- | --- |
| 1 | 0.049 | 48.78 | 0.001 |
| 5 | 0.244 | " | 0.005 |
| 10 | 0.488 | " | 0.010 |
| 15 | 0.732 | " | 0.015 |
| 20 | 0.976 | " | 0.020 |

As described above in association with the equation (1), the pulse radar method can compute the breakage location by dividing the products of the reflection time by the pulse propagation velocity into halves. Accordingly, in order to make the pulse propagation velocity known, the measuring device 20 measured the most standard cable (two parallel lines). Consequently, the pulse propagation velocity was 205 m/μsec.

It is desirable to set the period B of the transmitted wave to be greater than the maximum of the pulse propagation time in the wire harness on the vehicle, since a lap between a reflected wave and a next transmitted wave will make the measurement difficult in the case where the above measurement is effected by transmitting a pulse wave at a certain period. Accordingly, assuming that the maximum length of the wire harness on the vehicle is 10 m, the period B of the transmitted wave will be 48.78 n sec by dividing 10 m by 205 m/μsec.

Since a transmitted wave Pa overlaps on a reflected wave Pb and this will make the measurement of the pulse propagation time difficult when a difference in time between the transmitted wave Pa and the reflected wave Pb is smaller than the pulse width A of the transmitted wave, it is necessary to set the pulse width A to be small in order to shorten a distance from a measuring point to a start point capable of measuring a trouble location. When the pulse propagation velocity is set to be 205 m/μsec and the period B of the transmitted wave is to be 48.78 n sec, the above Table 1 shows a relationship between the distance from the measuring point to the start point capable of measuring the trouble location, and the pulse width A and the duty ratio (A/B).

It is possible to set the pulse width A in compliance with a measuring range of a trouble location on the basis of the above data.

The detection of a trouble location in the electric wire 2 in the wire harness on an automotive vehicle is carried out by the following manners.

In the case where any electrical equipments are brought into faultiness on account of a trouble in wire harnesses, first of all the trouble wire harness 1 associated with the faulty equipment is searched and then an electric wire 2 in trouble in the wire harness 1 is found by a tester. A connector or connectors on the wire harness 1 (at least a connector connected to the trouble electric wire) is detached from a mating connector. The trouble electric wire 2 is set to be a measuring line. The terminals 26A and 26B of the measuring device 20 are inserted into the detecting connector 13 so that the terminals 26A and 26B are connected to the measuring electric wire 11 branched from the measuring line 2 and the sensing electric wire 12 connected to the shield sheath 10.

When the measuring device 20 is actuated under this state, the pulse generating unit 21 in the device 20 transmits a pulse wave in a wire harness 1 as described above and the synchroscope 22 measures a time t in which a reflected wave turns back from a trouble point to the transmitting point. The computing unit 23 computes a distance L from the transmitting point to the trouble point by giving to the above equation (1) the time t and the known pulse propagation velocity v. Whether the trouble is breakage or short circuit can be judged on the basis of a polarity of the reflected wave with respect to that of the transmitted wave.

The distance L, breakage, and short circuit are indicated on the display unit 25. An operator can know the trouble location from the distance L indicated on the display unit 25.

Thus, it is possible to easily carry out detection of the trouble location and repair of the wire harness. In particular, since the trouble electric wire 2 is set to be a measuring line and the shield sheath 10 is set as a sensing line, a relatively simple structure can achieve a function for shielding the electric wires from external noises and can effect easily and precisely detection of the trouble location.

It is also possible to judge whether the trouble is breakage or short circuit by utilizing the pulse radar method.

Although the detection of a trouble location is effected by connecting the terminals 26A and 26B of the measuring device 20 to the trouble electric wire 2 and the shield sheath 10 (sensing line) after the trouble electric wire 2 has been found from the wire harness 1 by using a tester, in the above embodiment, each electric wire 2 in the wire harness 1 may be set as each measuring line by exchanging a connection of the terminals 26A and 26B in order and the measuring device 20 may detect a trouble electric wire 2. It is also possible to automatically and effectively detect a trouble electric wire and a trouble location by providing a connector in the measuring device 20 and by coupling the connector to a connector for the wire harness 1.

Figure 6:
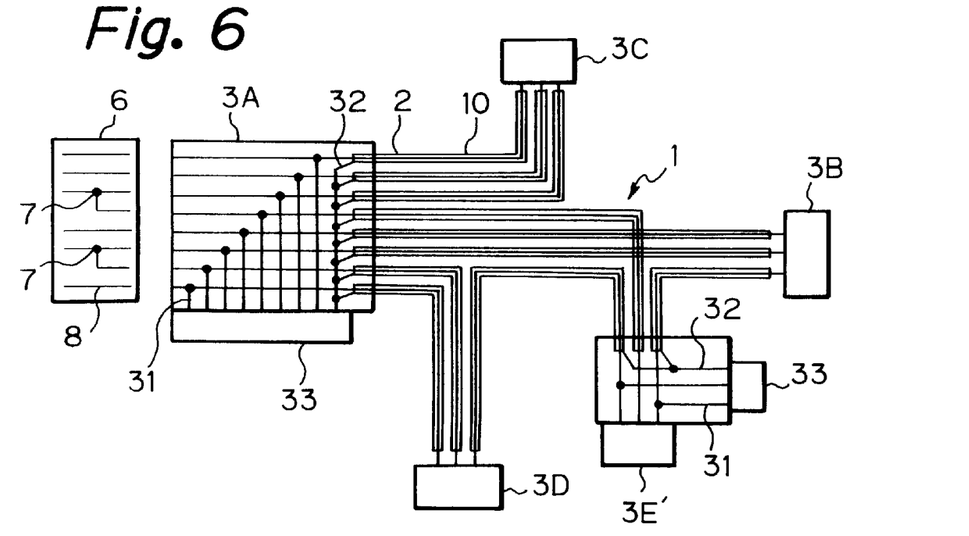
FIG. 6 is a schematic block diagram of a second embodiment of a wire harness in the present invention.
Figure 7:
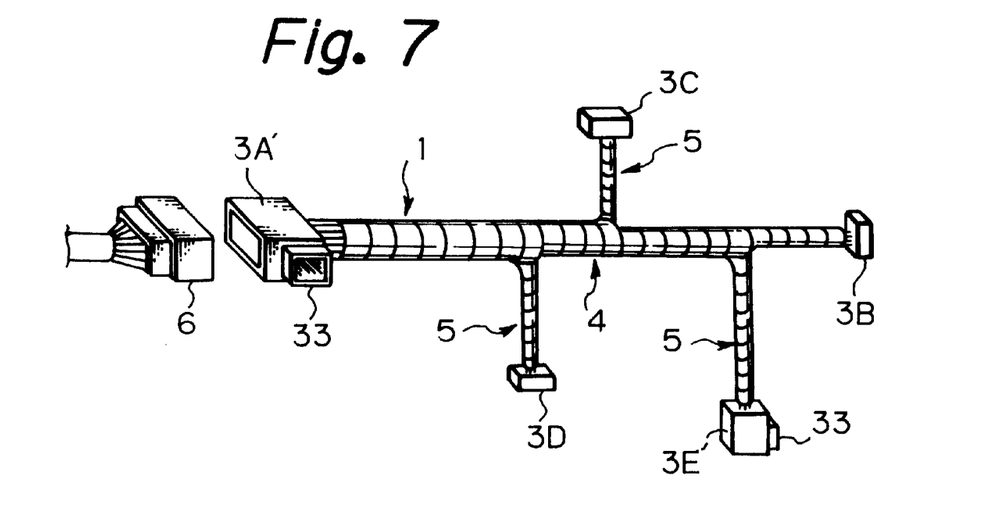
FIG. 7 is a perspective view of the second embodiment of the wire harness shown in FIG. 6.

FIGS. 6 and 7 show a second embodiment of an apparatus for detecting a trouble location in a wire harness 1 in accordance with the present invention.

The wire harness 1 illustrated in the drawings includes a number of electric wires connected to connectors 3A', 3B, 3C, 3D, and 3E'. Each electric wire is a single wire having no splice portion. A splice connector 6 is detachably coupled to the connector 3A' for electrical wiring. Each electric wire 2 is a shield wire with a conductive shield sheath 10. Upon detection of a trouble location, the shield sheath 10 of each electric wire serves as a sensing line. These respects are the same as the first embodiment.

In the second embodiment, however, measuring lines 31 branched from the electric wires 2 and sensing lines 32 connected to the shield sheath 10 are provided in the connectors 3A' and 3E' in a form of a bus bar or the like. A detecting connection portion 33 is formed together with each sensing line 32. Terminals of the sensing lines 32 are disposed on the connection portion 33.

In the second embodiment as well as the first embodiment, a trouble location in a wire harness 1 can be detected by the pulse radar method using the measuring device 20. Particularly, since the shield sheath 10 can be used as a sensing line, a shielding function and a detecting function of the trouble location can be achieved by a relatively simple structure.

Figure 8:
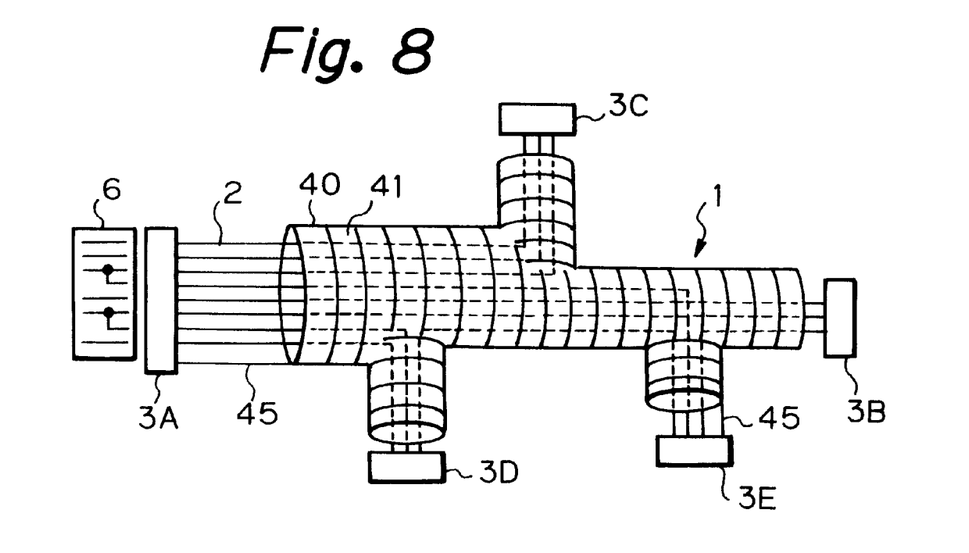
FIG. 8 is a schematic view of a third embodiment of the wire harness in the present invention.
Figure 9:
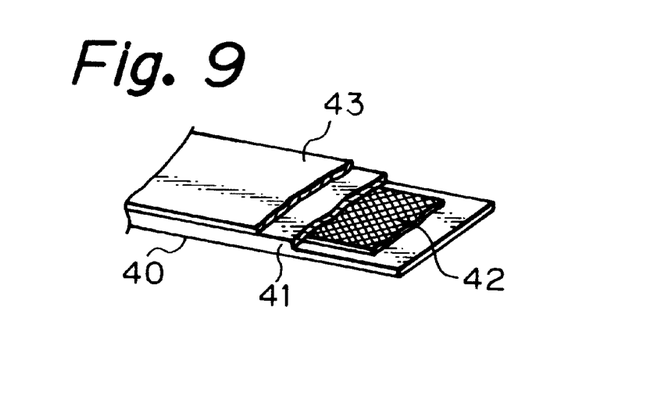
FIG. 9 is a fragmentary perspective view of a sheath for a wire harness.
Figure 10A:
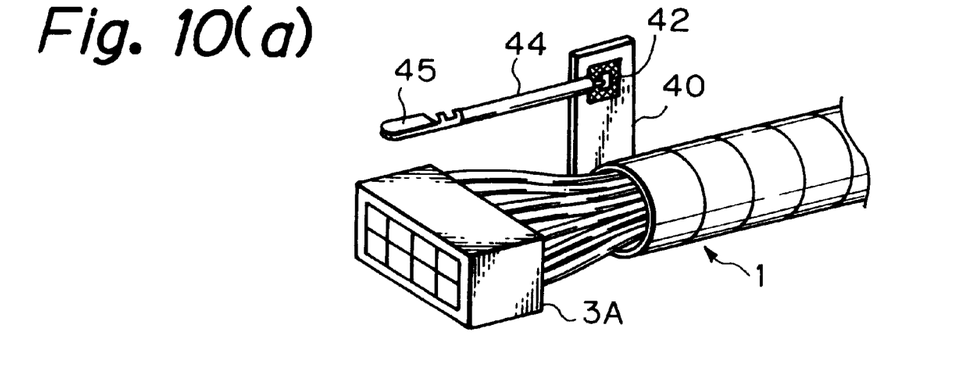
Figure 10B:
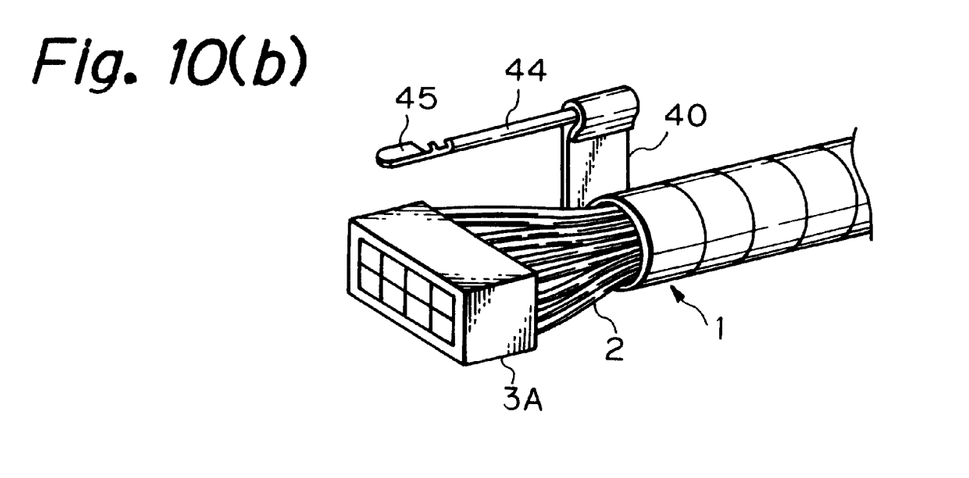
Figure 10C:
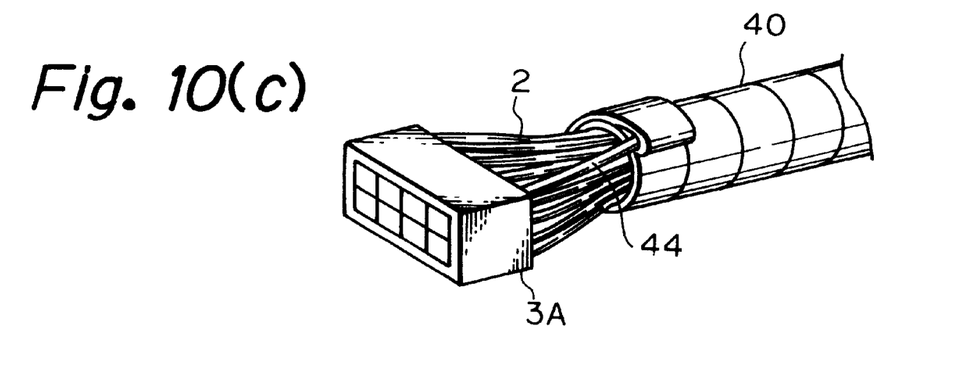

FIG. 8 is a schematic view of a third embodiment of the wire harness in the present invention. FIG. 9 is a fragmentary perspective view of a sheath for a wire harness. FIGS. 10(a), 10(b), and 10(c) are explanatory views illustrating the respective steps of working an end of the sheath for a wire harness.

The wire harness 1 in the third embodiment includes a number of electric wires 2 connected to connectors 3A to 3E. Each electric wire 2 is a single wire having no splice portion. A splice connector 6 is detachably coupled to the connector 3A for electrical wiring. These respects are the same as the first and second embodiment. However, the wire harness 1 is provided on the main and branch line parts with a sheath member (tape 40 described after) which covers and protects the parts together. The sheath member has a conductive layer which serves to shield the harness and to operate as a sensing line upon detection of trouble location.

In more detail, the sheath member is made of a tape 40 as shown in FIG. 9. The tape 40 includes an insulation layer 41, a conductive layer 42 embedded in the insulation layer 41, and an adhesive layer 43 applied on the inside of the insulation layer 43. The conductive layer 42 is made of any one or several ones of a shield line, a conductive plastic, a conductive paint, a conductive rubber or the like. The sheath member is formed by spirally winding the tape 40 on a bundle of wire harnesses 1.

A sensing electric wire 44 is connected to the conductive layer 42 on an end of the sheath member. A terminal 45 connected to an end of the sheath member is inserted in the connector 3A (3E). An example of a manner for working this portion will be explained below by referring to FIG. 10. First, as shown in FIG. 10(a), a part of the insulation layer on the inside of the end of the tape 40 constituting the sheath member is stripped to expose the conductive layer 42 on the inside of the tape 40. One end of the sensing electric wire 44 having the terminal 45 on the other end is connected to the conductive layer 42 by means of a supersonic wave welding method. Secondly, as shown in FIG. 10(b), the tape 40 is bent to wrap the connection portion of the conductive layer 42 and sensing electric wire 44. Further, as shown in FIG. 10(c), the terminal 45 of the sensing electric wire is inserted into the connector 3A.

Thus, the sensing electric wire 44 connected to the conductive layer 42 on the sheath member are connected to the connector 3A (3E) in parallel to each electric wire 2 in the wire harness.

In this embodiment, the trouble electric wire 2 is set as a measuring line and the terminals 26A and 26B of the measuring device 20 are connected to the terminal of the measuring line in the connector 3A (or 3E) and the terminal 45 of the sensing electric wire 44. The trouble location is detected by the pulse radar method. The conductive layer of the sheath member has a shield function for the electric wires and also a sensing function for detection of the trouble location.

Figure 11A:
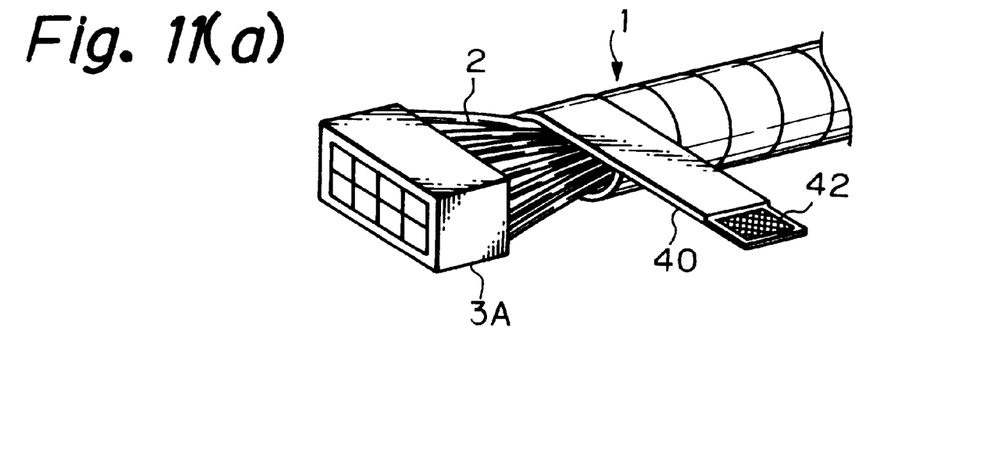
Figure 11B:
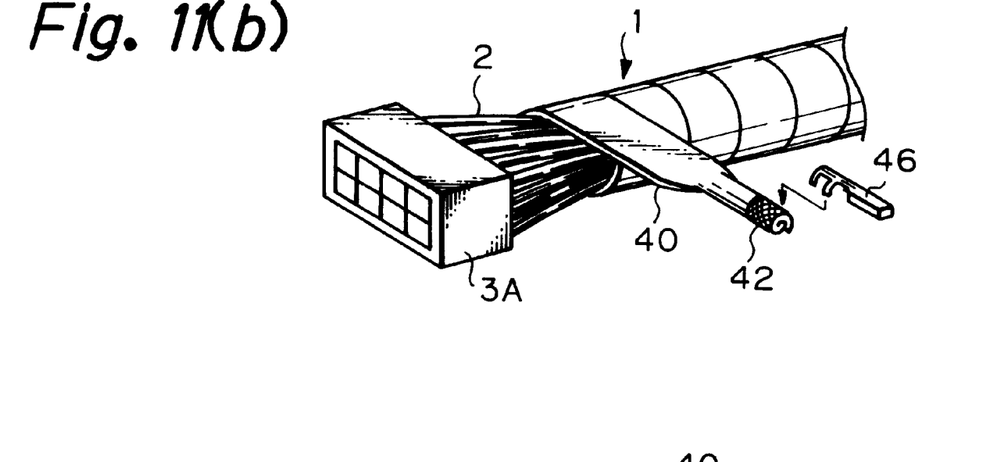
Figure 11C:
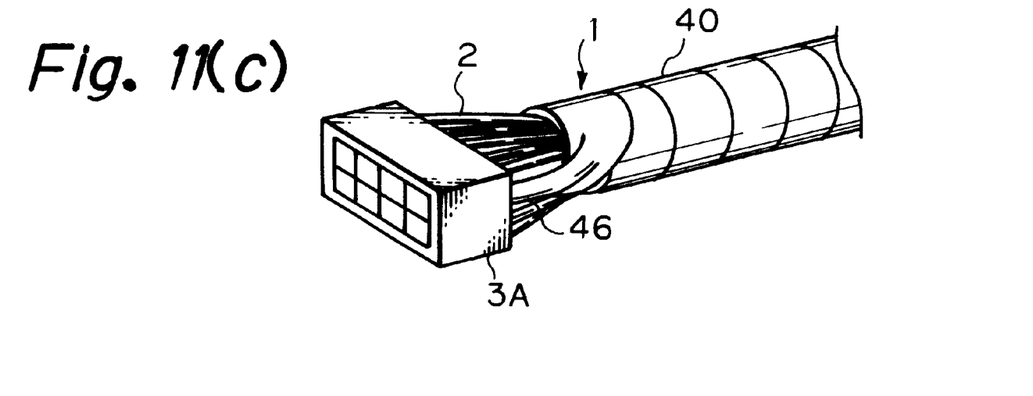

An end treatment of the conductive layer of the sheath member may be effected to make it the sensing line, as shown in FIG. 11. In this example, as shown in FIG. 11(a), a part of the outside insulation layer on an end of the tape 40 is stripped to expose the conductive layer 42. Then, as shown in FIG. 11(b), the stripped end is folded outwardly and the terminal 46 is pressed on the folded conductive layer 42. Finally, as shown in FIG. 11(c), the terminal 46 is inserted into the connector 3A.

In the case where the sheath member is made of the tape 40 as described above, the individual tapes are wound on the main and branch line parts of the wire harness 1, respectively and the conductive layers on these parts are interconnected.

Figure 12A:
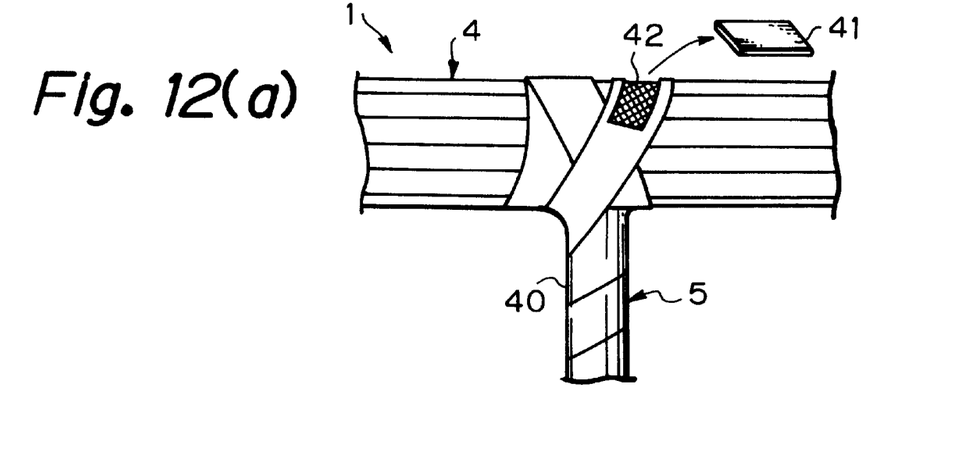
Figure 12B:
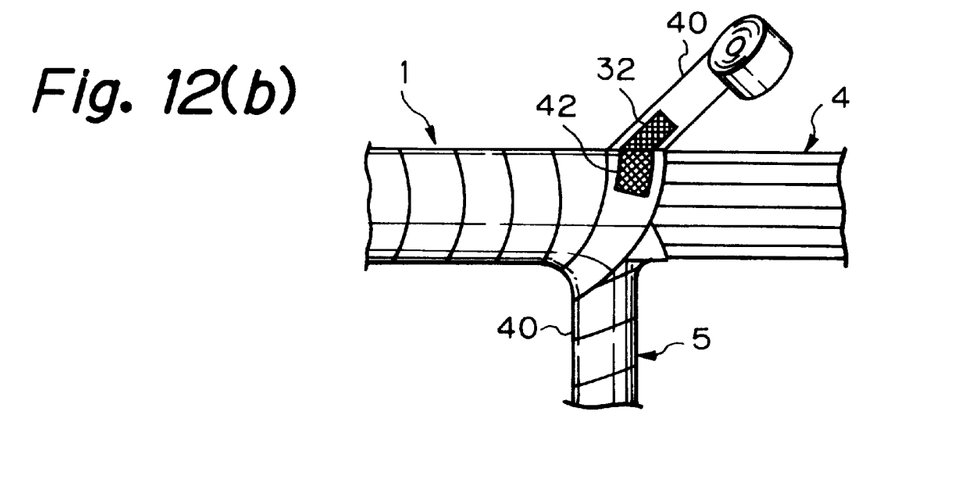

FIG. 12 shows an example of a working process. First, as shown in FIG. 12(a), the tape 40 is wound on the main line part 4 of the wire harness 1 from the proximal end of the branch line part 5 to the part 5. A part of the outside insulation layer 41 of the tape 40 on the proximal end of the branch line part 5 is stripped to expose the conductive layer 42. Secondly, as shown in FIG. 12(b), another tape 40 is wound on the main line part 4. The insulation layer of the trailing tape 40 is stripped to expose the conductive layer 42 at the portion to be overlapped on the exposed conductive layer 42 on the leading tape 40. Both exposed conductive layers 42, 42 are interconnected.

Thus, it is possible to easily connect the conductive layers 42 of the sheath members mounted on the respective parts of the wire harness 1.

Figure 13:
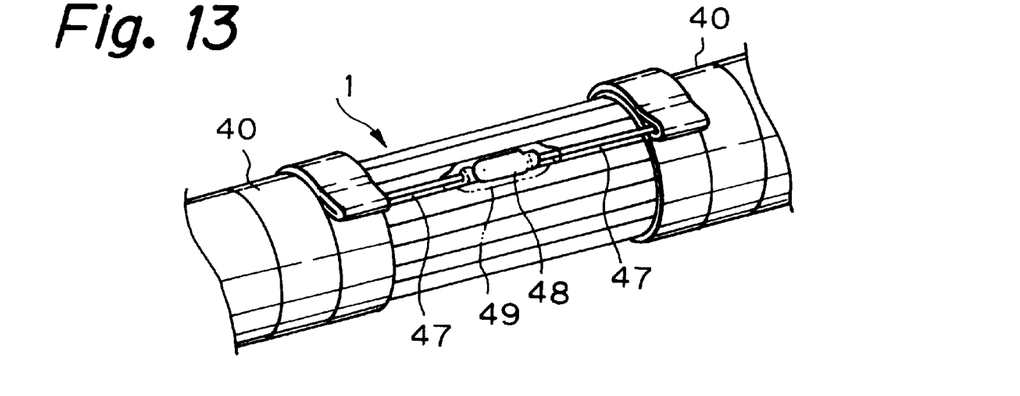
FIG. 13 is an explanatory view illustrating a step of interconnecting the sheaths on a wire harness.

In the case where the sheath member (tape 40) is separated in an intermediate of the wire harness 1, as shown in FIG. 13, each relaying electric wire 47 is connected to the conductive layer on each end of the separated tapes 40. The relaying electric wires 47 are connected to each other through a terminal 48. The terminal 48 is covered with an insulation tape 49.

Figure 14:
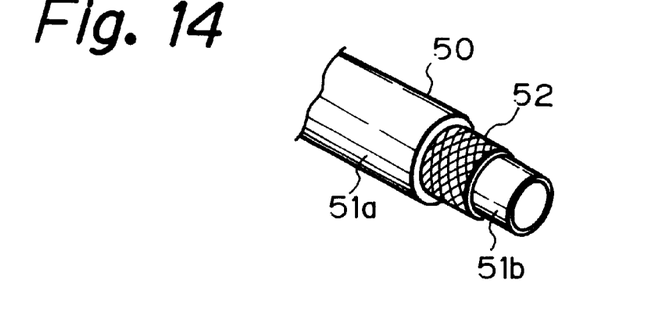
FIG. 14 is a fragmentary perspective view of another sheath for a wire harness.

The sheath member which protects the electric wires in the wire harness 1 is not limited to the tape 40 mentioned above. The sheath member may be formed of a tube 50, as shown in FIG. 14. The tube 50 includes an outer insulation layer 51a, an inner insulation layer 51b, and a conductive layer 52 interposed therebetween.

Figure 15:
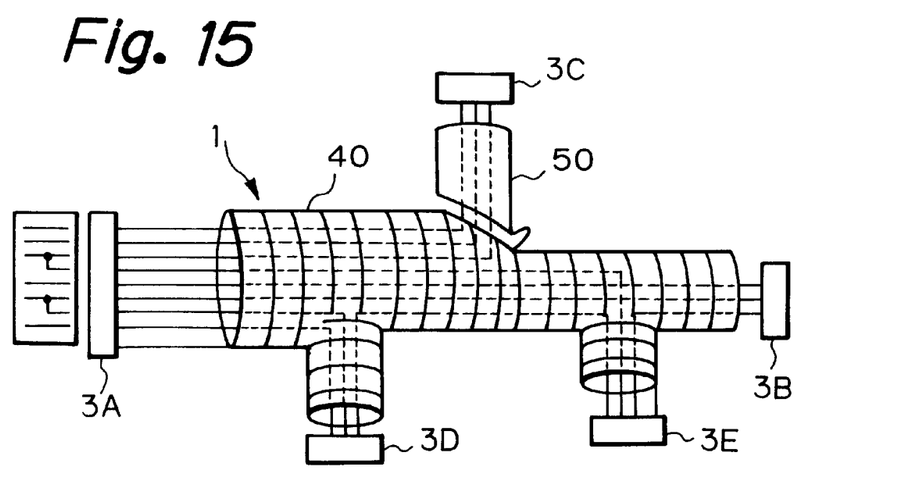
FIG. 15 is a schematic view of another sheath for a wire harness.
Figure 16:
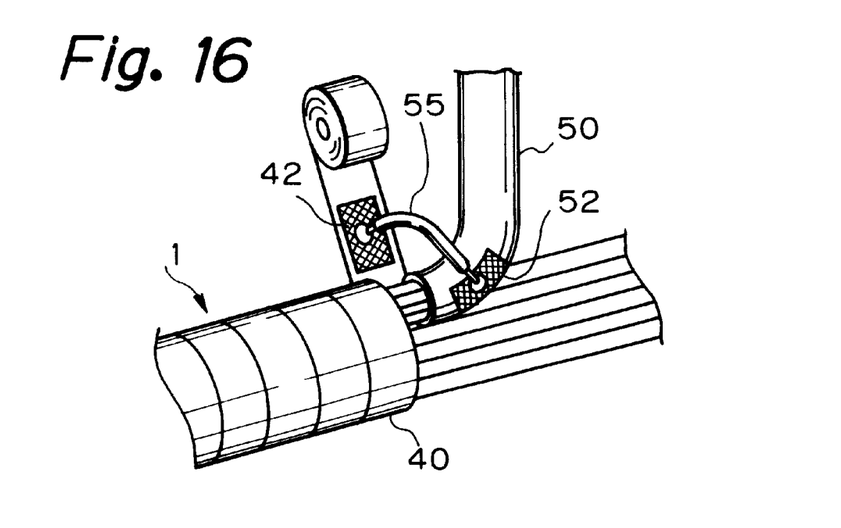
FIG. 16 is a perspective view of the sheath shown in FIG. 15.

Further, as shown in FIGS. 15 and 16, one sheath member on a part of the wire harness 1 may be constituted by the tube 50 while the other sheath member on another part of the wire harness 1 may be constituted by the tape 40. In this case, sheaths formed of the tape 40 and the tube 50 are preferably connected to each other at the exposed conductive layers 42 and 52 through a relaying electric wire 55.

It is possible according to the apparatus of the present invention to easily and precisely detect a trouble location in an electric wire in a wire harness by applying the pulse radar method to the wire harness, transmitting a pulse wave in a measuring line and a sensing line, and using a measuring device which measures a difference in time between a transmitted wave and a reflected wave. Particularly, each electric wire in the wire harness is made of a single wire with no splice portion and is formed into a shield wire with a conductive shield sheath. The shield sheath is set as a sensing line. Alternatively, a conductive layer is formed on the sheath member which protects the electric wires and the conductive layer is set as the sensing line. Accordingly, the apparatus of the present invention can shield the electric wire from noises and detect the trouble location, although the apparatus has a relatively simple structure.

What is claimed is:

1. An apparatus for detecting a trouble location in a wire harness, comprising:

a wire harness having a plurality of electric wires, in which a trouble location is to be detected, each of said electric wires being a single insulation-sheathed wire, said wire harness including a main line part and at least one branch line part, each of which is protected by a sheath member, at least one of said electric wires in said main line part extending into said branch line part without any splice;

a plurality of sensing lines juxtaposed along said electric wires; and a measuring device which transmits a pulse signal in said electric wires and said sensing lines at their ends and receives a reflected wave from a transmitted wave, said pulse signal having a pulse width (A) of 0.049–0.976 n sec, a period (B) of 48.78 n sec, and a duty ratio (A/B) of 0.001–0.020, thereby measuring a difference in time between the transmitted wave and the reflected wave;

each of said electric wires in said wire harness being covered with a conductive shield sheath, said wire harness having a connection part for connecting each of said electric wires and each shield sheath to said measuring device, thereby using said shield sheath as a sensing line upon detecting said trouble location;

whereby a distance from a transmitting end point to a trouble location point is determined in accordance with said difference in time and a signal propagation velocity;

said main line part having a main connector connected to said connection part and said branch line part having a branch connector at a distal end thereof, whereby said trouble location can be detected while said wire harness is installed in a vehicle.

2. The apparatus of claim 1 wherein said sheath member is a tape which includes a conductive layer between insulation layers, and an adhesive layer on either surface of said insulation layers.

3. The apparatus of claim 1 wherein said sheath member is a tube having a conductive layer between insulation layers.

4. The apparatus of claim 1 wherein said sheath member is a tape which includes a conductive layer between insulation layers, and an adhesive layer on either surface of said insulation layers.

5. The apparatus of claim 1 wherein said sheath member is a tube having a conductive layer between insulation layers.

6. The apparatus of claim 1 wherein said branch connector contains a terminal connected to said conductive shield sheaths on said electric wires.

7. The apparatus of claim 1 wherein said connection part provided on said wire harness includes a connector for partial electrical wiring and a detecting connector separately.

8. The apparatus of claim 1 wherein said connection part provided on said wire harness includes a connector for partial electrical wiring and a detecting connector which are formed together with each other.

* * * * *